United States Patent [19]

Fukushima

[11] Patent Number: 4,876,442
[45] Date of Patent: Oct. 24, 1989

[54] LASER CONTROL CIRCUIT

[75] Inventor: Masaya Fukushima, Tokyo, Japan

[73] Assignee: NEC Corporation, Tokyo, Japan

[21] Appl. No.: 264,570

[22] Filed: Oct. 31, 1988

[30] Foreign Application Priority Data

Oct. 30, 1987 [JP] Japan ................................. 62-273585

[51] Int. Cl.$^4$ ............................................... G01J 1/32
[52] U.S. Cl. ...................................... 250/205; 372/31
[58] Field of Search .............. 250/205, 214 C; 372/29, 372/31, 33, 34

[56] References Cited

U.S. PATENT DOCUMENTS 4,621,376 11/1986 Nakamura et al. .................... 372/29
4,733,398 3/1988 Shibagaki et al. ..................... 372/31
4,814,596 3/1989 Koizumi et al. ...................... 250/205

Primary Examiner—Edward P. Westin
Assistant Examiner—Khaled Shami
Attorney, Agent, or Firm—Sughrue, Mion, Zinn, Macpeak & Seas

[57] ABSTRACT

A laser control circuit is provided in which temperature compensation is achieved by controlling the bias current, thereby preventing intersymbol interference when the temperature of the semiconductor laser rises.

4 Claims, 2 Drawing Sheets

LASER CONTROL CIRCUIT

BACKGROUND OF THE INVENTION

The present invention relates to semiconductor laser control circuits for use in large-capacity optical communication systems, and more particularly to a laser control circuit in which temperature compensation is achieved by controlling the bias current.

In a prior art laser driving circuit for high-speed digital optical communication systems, a bias current $I_b$, slightly below a current $I_{th}$ (hereinafter referred to as the threshold current) at which the lasing action starts, is constantly fed to the semiconductor laser, and a pulse current corresponding to a digital modulating signal is caused to overlap the bias current $I_b$ to obtain an optical pulse signal. As the threshold current of the semiconductor laser varies with temperature, the bias current $I_b$ is so controlled as to keep the optical output power of the semiconductor laser constant. A semiconductor laser control circuit in which the bias current is controlled in this manner is disclosed in the U.S. Pat. No. Re. 31,969 (Shell). In Sell's laser control circuit, part of the laser's output light is detected with a light receiving element. The difference between a voltage corresponding to output level of the light receiving element. and another voltage proportional to the average voltage of an electrical modulating signal is amplified. Next, the amplified output is supplied to the laser as a prebias signal, thereby keeping the optical output power constant without relying on temperature and the pulse density of the electrical modulating signal.

However, at, higher temperatues, the bias current has to be increased above the threshold current $I_{th}$ to keep the optical output constant. This is necessary since, curve representing the relationship between the current and the optical output power (hereinafter referred to as the differential quantum efficiency, abbreviated to DQE) varies with temperature T, and in particular, with declines high temperature. Thus, a ratio $(I_b/I_{th})$ between the bias current $I_b$ and the threshold current $I_{th}$ increases with high temperature. Generally in a semiconductor laser, the higher the $I_b/I_{th}$ ratio, the greater the intersymbol interference, combined with an increase in the speed of modulating signals.

SUMMARY OF THE INVENTION

An object of the present invention, therefore, is to provide a laser control circuit wherein intersymbol interference hardly occurs even if the temperature of the semiconductor laser rises.

According to the invention, there is provided a laser control circuit wherein part of the optical output power of a semiconductor laser is detected and converted into an electric signal. The generated electronic signal controls a bias current to be supplied to the laser. The laser control circuit comprises a laser driving means for intensity-modulating the laser in response to an electrical modulating signal; a light receiving element for receiving part of the output light of the laser and outputting a current corresponding to the received optical power; current/voltage converting means for converting the output current from the light receiving element into a voltage at a prescribed current/voltage converting efficiency $A(T)$, the converting efficiency $A(T)$ having a positive temperature coefficient with respect to the temperature in the vicinity of the laser; and means for so controlling the bias current so as to keep constant the voltage provided by the current/voltage converting means.

The invention makes it possible to substantially equalize the bias current to the threshold current and thereby solves the problem of the prior art by giving the conversion efficiency $A(T)$ of the current/voltage converting circuit a positive temperature coefficient.

Strictly speaking, the bias current can be equalized to the threshold current by so setting the current/voltage converting efficiency $A(T)$ as to satisfy the condition of $$A(T)=A(T_0)\cdot DQE(T_0)/DQE(T)$$

wherein $DQE(T)$ is the differential quantum efficiency of the laser, and $A(T_0)$ and $DQE(T_0)$ are the current/voltage converting efficiency and the differential quantum efficiency, respectively, at a standard temperature $T_0$.

BRIEF DESCRIPTION OF THE DRAWINGS

The present invention will be better understood from the following detailed description taken in conjunction with the accompanying drawings, in which.

DETALED DESCRIPTION OF THE PREFERRED EMBODIMENT

Before describing the laser control circuit which is a preferred embodiment of the present invention, the difference in bias control between the prior art and the invention will be explained with reference to FIG. 3.

In the prior art, i.e. Sell's laser control circuit, the value of the bais current $I_b(T_0)$ of a semiconductor laser at a standard temperature $T_0$ is selected to be slightly below that of the threshold current $I_{th}(T_0)$. At the temperature $T_0$, the current/optical output.power relationship is like curve A, giving an optical output power P for a current of an amplitude $I_M$. With with a rise in temperature, the threshold current grows as indicated by curve B, resulting in a drop in differential quantum efficiency DQE. Since Sell's circuit controls the bias current so as to keep the optical output power constantly at P, the bias current $I_b(T_1)$ at a temperature $T_1$ $(T_1>T_0)$ has to be set at a level above the threshold current $I_{th}(T_1)$ at the same temperature. However an increased bias current at a level above the threshold level is more likely to cause intersymbol interference and to deteriorate the extinction ratio.

The present invention prevents intersymbol interference in high-speed digital optical communication by making it possible to automatically set the bias current at a temperature $T_1$ substantially equal to $I_{th}(T_1)$ instead of $I_b(T_1)$.

According to the invention, since, the bias current is controlled so as to be substantially equal to the threshold current, the optical output power decreases with a rise in temperature. The power decrease, however, is only about 2 dB in a high temperature range, and therefore would pose no problem in normal use because an optical communication system is usually designed to permit an optical pulse decrease of up to 5 dB.

Figure 1:
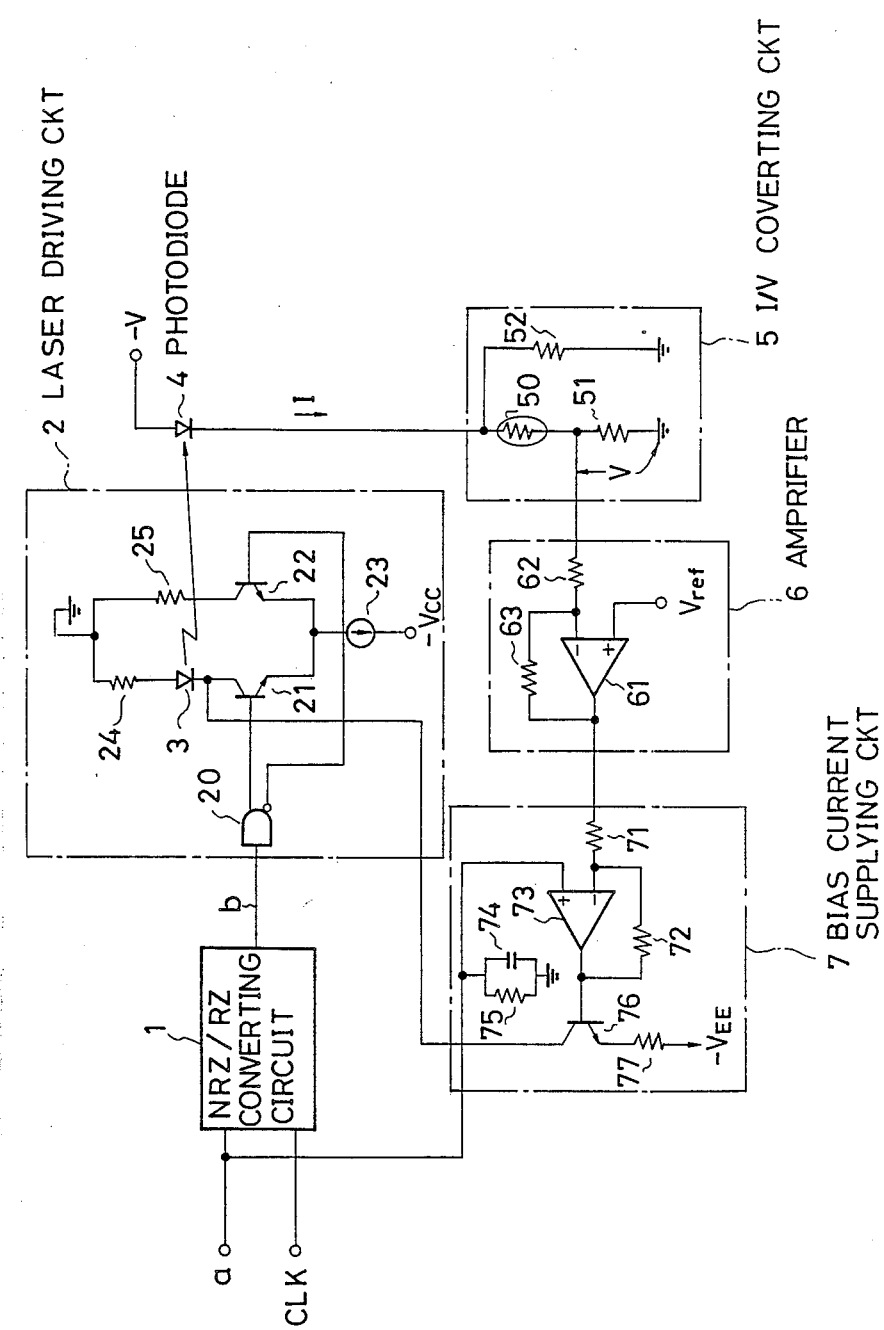
FIG. 1 is a circuit diagram illustrating a preferred embodiment of the present invention.

FIG. 1 is a circuit diagram illustrating a preferred embodiment of the present invention.

In the figure, a digital modulating signal a, which is a Nonreturn-to-Zero (NRZ) signal, is converted by an NRZ/RZ converting circuit 1 into a Return-to-Zero (RZ) signal b. A laser driving circuit 2, having a semiconductor laser 3 and driving means thereof, intensity-modulates the laser 3 in accordance with the RZ signal from the NRA/RZ converting circuit 1. A light beam from the laser 3 is received by a photodiode 4, whose output current is supplied to a current/voltage (I/V) converting circuit 5. The I/V converting circuit 5, having a temperature sensor (thermistor 50) for detecting the temperature in the vicinity of the laser 3, controls the I/V converting efficiency according to the temperature. The output voltage of the I/V converting circuit 5 is amplified by a amplifier 6 and supplied to a bias current supplying circuit 7. The bias currents supplying circuit 7 generates and supplies to the laser 3 a bias current according to the voltage extracted from the modulating signal and the output voltage of the amplifier 6.

Whereas a characteristic feature of the preferred embodiment contains the I/V converting circuit 5, its action will be described in further detail later on in this specification.

Figure 2:
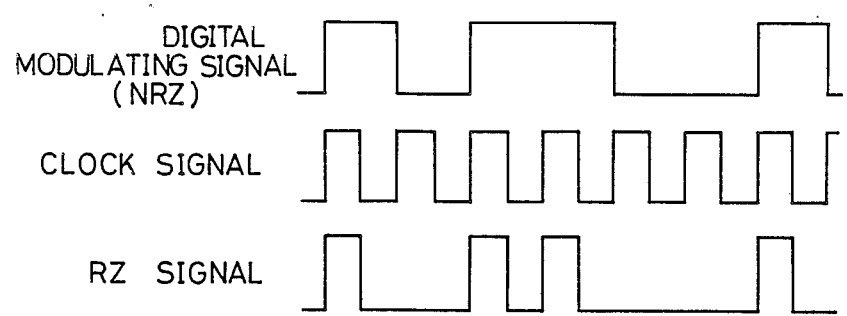
FIG. 2 is a time chart illustrating the input/output operations of the NRZ/RZ converting circuit in FIG. 1.

The NRZ/RZ converting circuit 1, as shown in FIG. 2, converts the modulating signal a into the RZ signal b in synchronism with a clock signal CLK. The RZ signal b is supplied to a logic circuit 20 of the driving circuit 2 and converted into an inverted signal and an uninverted signal. The uninverted signal is supplied to the base of a transistor 21 and the inverted signal is supplied to the base of a transistor 22. The emitters of the transistors 21 and 22 are commonly connected to a constant current source 23. The transistors 21 and 22 are alternately turned on and off according to the logical level of the RZ signal. The semiconductor laser 3 is connected between the collector of the transistor 21 and a resistor 24, and supplied with a bias current from the bias current supplying circuit 7. One end each of resistors 24 and 25 are grounded, and a negative power source is connected to the constant current source 23. Part of the light emitted from the laser 3 is received by the photodiode 4 and converted into an electric current. The photodiode 4, responding at a lower speed than that of the RZ signal, outputs an averaged current. The I/V converting circuit 5 includes the thermistor 50 for detecting the temperature in the vicinity of the laser 3, a resistor 51 positioned in series to the thermistor 50, and another resistor 52 arranged in parallel to the serial circuit comprising the thermistor 50 and the resistor 51. The I/V converting circuit 5 uses the therminal voltage of the resistor 51 as its output voltage V, which is represented by the following equation.

$$V = \frac{R1 \cdot R2}{R(T) + R1 + R2} \cdot I$$

where I is the current from the photodiode 4, and R(T), R1 and R2 are the resistances of the thermistor 50, and the resistors 51 and 52, respectively.

Therefore, the I/V converting efficiency A(T) is:

$$A(T) = \frac{R1 \cdot R2}{R(T) + R1 + R2} \quad (1)$$

Since a thermistor has a negative temperature coefficient and R(T) decreases with a rise in temperature, A(T) has a positive temperature coefficient. Therefore, the I/V converting efficiency improves with a rise in temperature. As explained below, this is necessary for setting the bias current equal to the threshold current of the laser.

The output voltage of the I/V converting circuit 5 is fed to the inverted input terminal of an OP amplifier 61 by way of a resistor 62 of the differential amplifier 6. To the uninverted input terminal of the OP amplifier 61 is fed a reference voltage $V_{ref}$, which is the value of the output voltage V when the bias current $I_b(T_0)$ supplied to the laser 3 at the temperature $T_0$ is equal to the threshold current $I_{th}(T_0)$. The amplifier 6 amplifies the difference between the voltage V and the reference voltage $V_{ref}$ by an amplifying rate determined by the ratio between resistors 62 and 63. The output of the amplifier 6 is supplied to the inverted input of an OP amplifier 73 by way of an input resistor 71 of the bias current supplying circuit 7. The uninverted input of the OP amplifier 73, meanwhile, is supplied with a signal resulting from the averaging of the integrated output of the digital modulating signals a, i.e. signals a, by a circuit consisting of a resistor 75 and a condenser 74 connected in parallel. The difference between the averaged signal of the signals a and the output signal of the amplifier 6 is amplified by a differential amplifier consisting of resistors 71 and 72 and the OP amplifier 73, and supplied to the base of a transistor 76, whose emitter and collector are respectively connected to the negative power source by way of a resistor 77 and to the laser 3. The collector current of the transistor 76 constitutes the bias current of the laser 3.

In this preferred embodiment, the photodiode 4, I/V converting circuit 5, amplifier 6 and bias current supplying circuit 7 constitute a feed back circuit, which so adjusts the bias current of the laser 3 that the output voltage V of the I/V converting circuit 5 becomes equal to the reference voltage $V_{ref}$. Even if the mark rate of the modulating signal a varies, the inverted and uninverted inputs of the OP amplifier 73 will vary at equal rates, so that the base voltage of the transistor 76 will not change. Accordingly any variation in the mark rate of the signal a will generate no change in bias current. Meanwhile, when the temperature of the laser 3 rises, the action of the I/V converting circuit 5 plays an important role.

Figure 3:
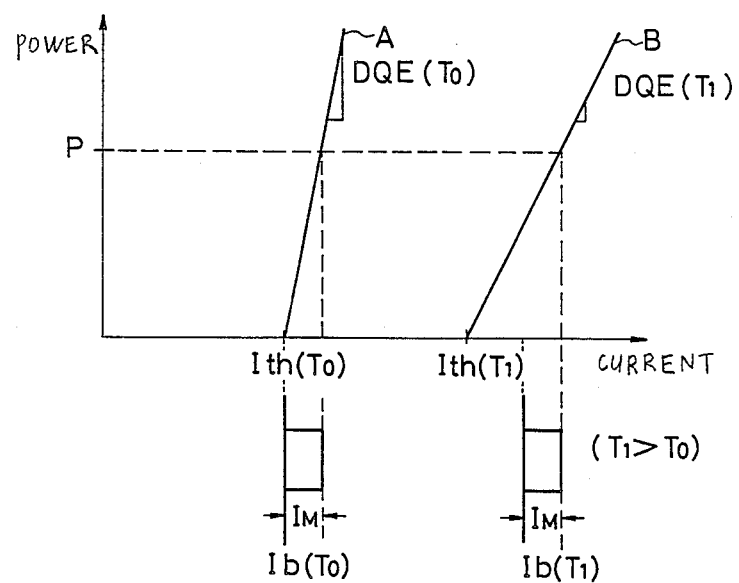
FIG. 3 is a diagram illustrating the current/optical output power relationship of a semiconductor laser.

As illustrate in FIG. 3, the differential quantum efficiency of the semiconductor laser 3 is represented by DQE(T); the threshold current, by $I_{th}(T)$; the bias current, by $I_b(T)$; and the current amplitude, by $I_M$, all at a given temperature T.

A case is now supposed in which, after $I_b(T_0)$ is set equal to $I_{th}(T_0)$, the temperature changes to $T_1$. The following equations will then hold, with the performance characteristic of the I/V converting circuit 5 being represented by V=A(T).I where A(T) represents the converting efficiency):

$$I_0 = \frac{1}{A(T_0)} V_0 \quad (2)$$

$$I_1 = \frac{1}{A(T_1)} V_1 \quad (3)$$

$$V_0 = V_1 = V_{ref} \quad (4)$$

$$P_0 = I_m \, DQE(T_0) \quad (5)$$

-continued
$$P_1 = \{I_M + I_b(T_1) - I_{th}(T_1)\} \cdot DQE(T_1) \quad (6)$$

where $I_0$, $V_0$ and $P_0$ represent the monitor current from the photodiode 4, the output voltage of the circuit 5 and the optical output power of the laser 3, respectively, at the temperature $T_0$. Similarly $I_1$, $V_1$ and $P_1$ represent the corresponding values at the temperature $T_1$. Since the monitor current values $I_0$ and $I_1$ are proportional to the optical output power levels $P_0$ and $P_1$, respectively, $I_0/I_1 = P_0/P_1$. As a result, the following equation derives from Equations (2) through (6):

$$\frac{A(T_1)}{A(T_0)} = \frac{DQE(T_0)}{DQE(T_1)} \cdot \frac{I_M}{I_M + I_b(T_1) - I_{th}(T_1)} \quad (7)$$

The present invention requires that the bias current supplied to the laser 3 be equal to the threshold current, i.e. $I_b(T_1) = I_{th}(T_1)$. Incorporating this requirement into Equation (7) gives:

$$A(T_0)/A(T_1) = DQE(T_1)/DQE(T_0) \quad (8)$$

From Equation (8) the following equation is derived, which represents the I/V converting efficiency $A(T)$ when the bias current is equal to the threshold current:

$$A(T) = A(T_0) \cdot DQE(T_0)/DQE(T) \quad (9)$$

As DQE(T) lowers with a rise in temperature, the converting efficiency $A(T)$ increases, with the result that the temperature coefficient of Equation (9) is positive like that of $A(T)$ in Equation (1) above. If Equation (1) is combined with Equation (9) to determine resistances R1 and R2, $I_b(T) = I_{th}(T)$ can be realized.

A structure to embody the present invention is not limited to what is illustrated in FIG. 1. For instance, though the I/V converting circuit 5 herein is a voltage dividing circuit comprising resistors and a thermistor, it can be replaced with any other circuit whose I/V converting efficiency has a positive temperature coefficient. The laser driving circuit 2, composed of an emitter-coupled transistor circuit, may as well consist of a single FET transistor. Further, the uninverted input to the OP amplifier 73 may be the output signal of the NRZ/RZ converting circuit instead of the input signal.

As described in detail above, since the laser control circuit according to the present invention is structured so that the ratio between the bias current $I_b$ and the threshold current $I_{th}$ remains substantially equal to 1 irrespective of the variation of the differential quantum efficiency of the semiconductor laser with temperature. Thus, the temperature-dependent variation of the optical output waveform can be suppressed to ensure a desired quality standard of the optical transmission path.

What is claimed is:

1. A laser control circuit responsive to an electrical modulating signal, wherein part of the optical output power of a semiconductor laser is detected and converted into an electric signal for controlling a bias current to be supplied to said laser, said laser control circuit comprising:
   laser driving means for intensity-modulating said laser in response to said electrical modulating signal;
   a light receiving element for receiving part of the output light of said laser and outputting a current corresponding to the optical power of said output light received;
   current/voltage converting means for converting said output current from said light receiving element into a voltage at a prescribed current/voltage converting efficiency $A(T)$, said converting efficiency $A(T)$ having a positive temperature coefficient with respect to the temperature in the vicinity of said laser; and
   control means for so controlling said bias current so as to keep constant said voltage provided by said current/voltage converting means.

2. A laser control circuit, as claimed in claim 1, wherein said control means comprises:
   means for outputting a first voltage proportional to the difference between the output voltage of said current/voltage converting means and a reference voltage, and
   means for prebiasing said laser according to the difference between a second voltage, which is a signal extracted from said electrical modulating signal, and said first voltage.

3. A laser control circuit, as claimed in claim 1, wherein said current/voltage converting efficiency $A(T)$ is set so as to substantially satisfy the condition of $$A(T) = A(T_0) \cdot DQE(T_0)/DQE(T)$$

wherein $A(T_0)$ and $DQE(T_0)$ are respectively the current/voltage converting efficiency and the differential quantum efficiency of said laser at a standard temperature $T_0$, and $DQE(T)$ is the differential quantum efficiency of said laser at a temperature T.

4. A laser control circuit, as claimed in claim 2, wherein said means for outputting a first voltage proportional to the difference between the output voltage of said current-voltage converting means and a reference voltage includes a thermistor, a first resistor positioned in series with said thermistor, and a second resistor arranged in parallel to the series circuit comprising said thermistor and said first resistor.

* * * * *